(12) United States Patent
Wu

(10) Patent No.: US 10,861,836 B2
(45) Date of Patent: Dec. 8, 2020

(54) INTERPOSER FRAME AND METHOD OF MANUFACTURING THE SAME

(71) Applicant: Taiwan Semiconductor Manufacturing Co., Ltd., Hsin-Chu (TW)

(72) Inventor: Jiun Yi Wu, Zhongli (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/578,297

(22) Filed: Sep. 21, 2019

(65) Prior Publication Data

US 2020/0020674 A1    Jan. 16, 2020

Related U.S. Application Data

(60) Division of application No. 15/632,958, filed on Jun. 26, 2017, which is a continuation of application No.
(Continued)

(51) Int. Cl.
*H01L 25/10* (2006.01)
*H01L 23/538* (2006.01)
(Continued)

(52) U.S. Cl.
CPC ........ *H01L 25/105* (2013.01); *H01L 21/4803* (2013.01); *H01L 21/4846* (2013.01);
(Continued)

(58) Field of Classification Search
CPC ......... H01L 23/49838; H01L 23/49866; H01L 23/49833; H01L 23/49827;
(Continued)

(56) References Cited

U.S. PATENT DOCUMENTS 5,468,681 A    11/1995    Pasch
5,834,799 A    11/1998    Rostoker et al.
(Continued)

OTHER PUBLICATIONS

Final Office Action received Dec. 13, 2019 in connection with U.S. Appl. No. 15/632,958.
(Continued)

*Primary Examiner* — Bac H Au
(74) *Attorney, Agent, or Firm* — Eschweiler & Potashnik, LLC

(57) ABSTRACT

Some embodiments relate to a package. The package includes a first substrate, a second substrate, and an interposer frame between the first and second substrates. The first substrate has a first connection pad disposed on a first face thereof, and the second substrate has a second connection pad disposed on a second face thereof. The interposer frame is arranged between the first and second faces and generally separates the first substrate from the second substrate. The interposer frame includes a plurality of through substrate holes (TSHs) which pass entirely through the interposer frame. A TSH is aligned with the first and second connection pads, and solder extends through the TSH to electrically connect the first connection pad to the second connection pad.

20 Claims, 6 Drawing Sheets

Related U.S. Application Data

13/433,210, filed on Mar. 28, 2012, now Pat. No. 9,691,636.

(60) Provisional application No. 61/594,141, filed on Feb. 2, 2012.

(51) Int. Cl.

| | | |
|---|---|---|
| *H01L 23/14* | (2006.01) | |
| *H01L 23/498* | (2006.01) | |
| *H01L 21/48* | (2006.01) | |
| *H01L 25/00* | (2006.01) | |
| *H01L 23/31* | (2006.01) | |
| *H01L 21/56* | (2006.01) | |

(52) U.S. Cl.
CPC ............ *H01L 21/563* (2013.01); *H01L 23/14* (2013.01); *H01L 23/145* (2013.01); *H01L 23/3121* (2013.01); *H01L 23/49816* (2013.01); *H01L 23/49827* (2013.01); *H01L 23/49833* (2013.01); *H01L 23/49838* (2013.01); *H01L 23/49866* (2013.01); *H01L 23/5384* (2013.01); *H01L 23/5385* (2013.01); *H01L 25/50* (2013.01); *H01L 23/147* (2013.01); *H01L 2224/16225* (2013.01); *H01L 2224/32225* (2013.01); *H01L 2225/1023* (2013.01); *H01L 2225/1041* (2013.01); *H01L 2225/1058* (2013.01); *H01L 2924/1305* (2013.01); *H01L 2924/13091* (2013.01); *H01L 2924/15321* (2013.01)

(58) Field of Classification Search
CPC ........... H01L 23/49816; H01L 23/5385; H01L 23/5384; H01L 2225/1058; H01L 21/4846
See application file for complete search history.

(56) References Cited

U.S. PATENT DOCUMENTS

| | | | |
|---|---|---|---|
| 5,972,734 | A | 10/1999 | Carichner |
| 6,121,553 | A | 9/2000 | Shinada et al. |
| 6,297,141 | B1 | 10/2001 | Miyazaki |
| 6,528,348 | B2 | 3/2003 | Ando |
| 6,642,624 | B2 | 11/2003 | Sakai |
| 7,230,330 | B2 | 6/2007 | Lee et al. |
| 7,851,894 | B1 | 12/2010 | Scanlan |
| 8,283,767 | B1 | 10/2012 | Berry |
| 8,704,354 | B2 | 4/2014 | Cheng et al. |
| 9,691,636 | B2 | 6/2017 | Wu |
| 2004/0009727 | A1 | 1/2004 | Lin et al. |
| 2004/0178508 | A1 | 9/2004 | Nishimura |
| 2006/0202322 | A1 | 9/2006 | Kariya et al. |
| 2008/0157326 | A1 | 7/2008 | Han et al. |
| 2009/0121344 | A1 | 5/2009 | Sunohara |
| 2009/0166080 | A1 | 7/2009 | Matsui |
| 2009/0212420 | A1 | 8/2009 | Hedler et al. |
| 2010/0117218 | A1 | 5/2010 | Park et al. |
| 2010/0164120 | A1 | 7/2010 | Nakayama et al. |
| 2010/0171206 | A1 | 7/2010 | Chu |
| 2010/0289133 | A1 | 11/2010 | Chao et al. |
| 2010/0327419 | A1 | 12/2010 | Muthukumar et al. |
| 2010/0330747 | A1 | 12/2010 | Shin et al. |
| 2011/0221044 | A1 | 9/2011 | Danek et al. |
| 2011/0291287 | A1 | 12/2011 | Wu et al. |
| 2012/0119388 | A1 | 5/2012 | Cho et al. |
| 2012/0186861 | A1 | 7/2012 | Shimizu et al. |

OTHER PUBLICATIONS

CJ, Bill, et al., "Advanced QFN Packaging for Low Cost and Solution", 2010 11th International Conference on Electronic Packaging Technology & High Density Packaging, pp. 45-49.

Lim, L. A., et al., "DreamPAK—Small Form Factor Package", EMPC 2009, pp. 1-6.

Tseng, Andy, et al, "Advanced QFN Surface Mount Application Notes Development", 2010 12th Electronics Packaging Technology Conference, pp. 737-742.

Servais, G. E., et al., "Wire Bonding—A Closer Look", The 17th International Symposium for Testing & Failure Analysis, Nov. 11-15, 1991, pp. 525-529.

Non-Final Office Action dated Aug. 6, 2014 for U.S. Appl. No. 13/433,210.

Final Office Action dated Nov. 19, 2014 for U.S. Appl. No. 13/433,210.

Non-Final Office Action dated Apr. 28, 2015 for U.S. Appl. No. 13/433,210.

Final Office Action dated Sep. 16, 2015 for U.S. Appl. No. 13/433,210.

Non-Final Office Action dated Jun. 23, 2016 for U.S. Appl. No. 13/433,210.

Notice of Allowance dated Feb. 23, 2017 for U.S. Appl. No. 13/433,210.

Non-Final Office Action dated Jun. 3, 2019 for U.S. Appl. No. 15/632,958.

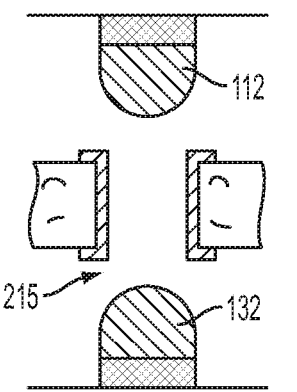
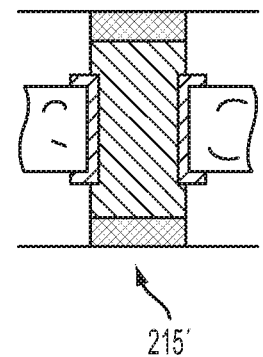
FIG. 5A    FIG. 5B
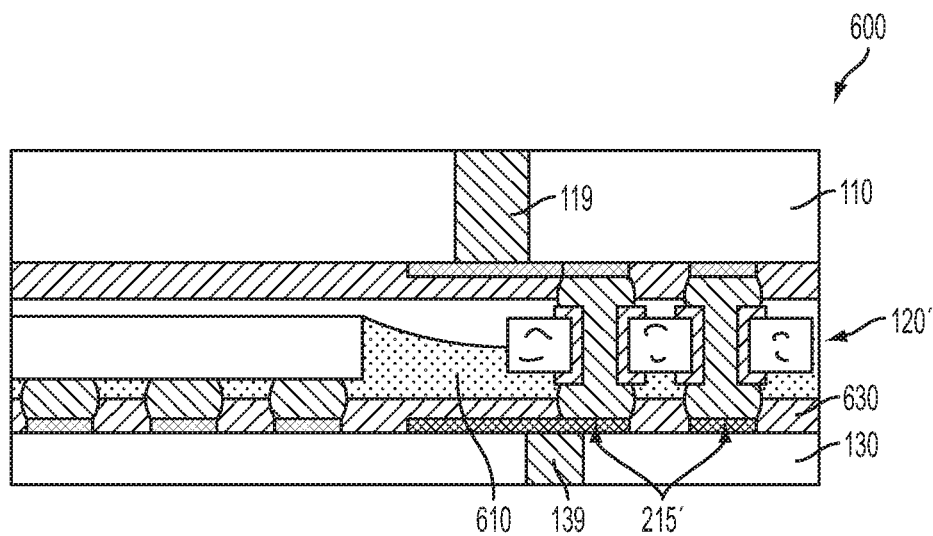
FIG. 6

— continued —

INTERPOSER FRAME AND METHOD OF MANUFACTURING THE SAME

REFERENCE TO RELATED APPLICATIONS

This Application is a Divisional of U.S. application Ser. No. 15/632,958, filed on Jun. 26, 2017, which is a Continuation of U.S. application Ser. No. 13/433,210, filed on Mar. 28, 2012 (now U.S. Pat. No. 9,691,636, issued on Jun. 27, 2017), which claims the benefit of U.S. Provisional Application No. 61/594,141 filed on Feb. 2, 2012. The contents of the above-referenced Patent Applications are hereby incorporated by reference in their entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less areas or heights than packages of the past, in some applications.

Thus, new packaging technologies, such as wafer level packaging (WLP) and package on package (PoP), have begun to be developed. These relatively new types of packaging technologies for semiconductors face manufacturing challenges.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 5A is a cross-sectional view of a through substrate hole (TSH) placed between two solder balls, in accordance with some embodiments.

FIG. 5B is a cross-sectional view of the solder balls filling the TSH, in accordance with some embodiments.

FIG. 6 is a cross-sectional view of a portion of a PoP package after the solder layers of an upper and an lower packages fill through substrate holes (TSHs) to form through substrate vias (TSVs), in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are illustrative and do not limit the scope of the disclosure.

Figure 1A:
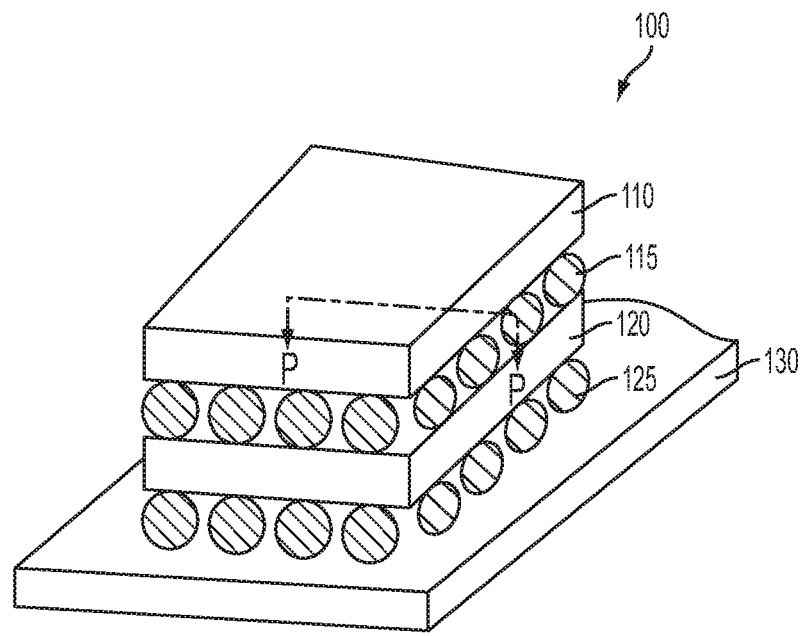
FIG. 1A is a perspective view of a package using the PoP technology (also referred to as "a PoP package" or "a PoP structure") including a package bonded to another package, which is further bonded to a substrate in accordance with some embodiments.

FIG. 1A is a perspective view of a PoP package (or PoP structure) 100 including a package 110 bonded to another package 120, which is further bonded to a substrate 130 in accordance with some embodiments. Each package, such as package 110 or package 120, includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Substrate 130 may be made of a semiconductor wafer, or a portion of wafer. In some embodiments, substrate 130 includes silicon, gallium arsenide, silicon on insulator ("SOI") or other similar materials. In some embodiments, substrate 130 also includes passive devices such as resistors, capacitors, inductors and the like, or active devices such as transistors. In some embodiments, substrate 130 includes additional integrated circuits. Substrates 130 may further include through substrate vias (TSVs) and may be an interposer. In addition, the substrate 130 may be made of other materials. For example, in some embodiments, substrate 130 is a multiple-layer circuit board. In some embodiments, substrate 130 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

Figure 1B:
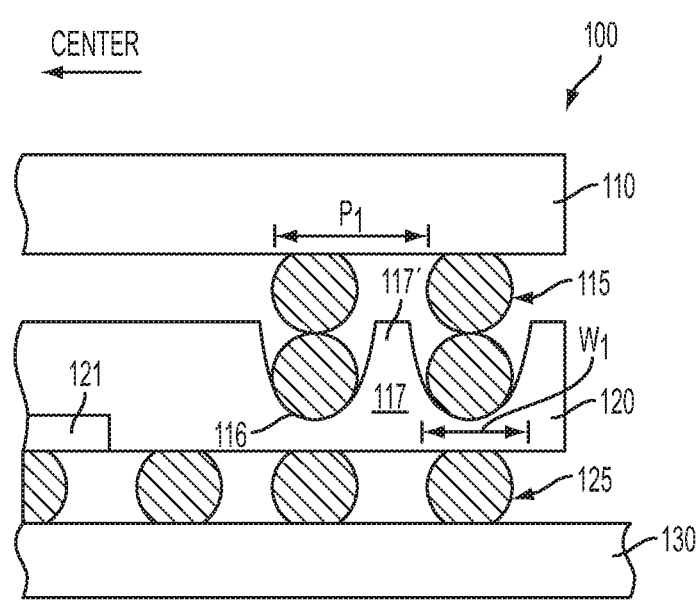
FIG. 1B is a cross-sectional view of a portion of the PoP package of FIG. 1A cut along line P-P, in accordance with some embodiments.

Package 110 is bonded to package 120 via connectors 115, and package 120 is bonded to substrate 130 via connectors 125. FIG. 1B is a cross-sectional view 150 of a portion of the PoP package of Figure 1A cut along line P-P, in accordance with some embodiments. FIG. 1B shows connectors 115 and 125 near the edge of chip package 100. FIG. 1B also shows a semiconductor die 121 of package 120. There are connectors 125 near the center of package 120, in some embodiments. A portion of connectors 115 is formed in openings 116 of package 120. Openings 116 are formed by etching the molding material of package 120. As a result, connectors 115 may also be called through molding vias (TMVs). In some embodiments, the openings 116 are formed by laser drills, and the width $W_1$ of openings 116 is in a range from about 300 μm to about 600 μm. In some embodiments, the pitch $P_1$ between two adjacent connectors 115 is in a range from about 400 μm to about 800 μm. The relatively large pitch limits design flexibility and complexity that are needed for advanced devices. In addition, laser drill of openings 116 leaves the isolation regions 117 between connectors 115 relatively thin in the top portions 117', which increase the risk of shorting between connectors 115. Therefore, there is a need of finding alternative mechanisms for forming connectors 115 between package 110 and package 120.

Recently, packaging frames become available for integrated circuit (IC) packaging. These packaging frames have conductive columns with thermal dissipation function similar to through substrate vias and are fit around packaged dies. Because the packaging frames are fixed around packaged dies, the form factor is smaller than interposers. The examples of such packaging frames include, but are not limited to, DreamPak of ASM Pacific Technology Ltd. of Singapore, and Leadless-aQFN by ASE Inc. of Taipei, Taiwan.

Figure 2:
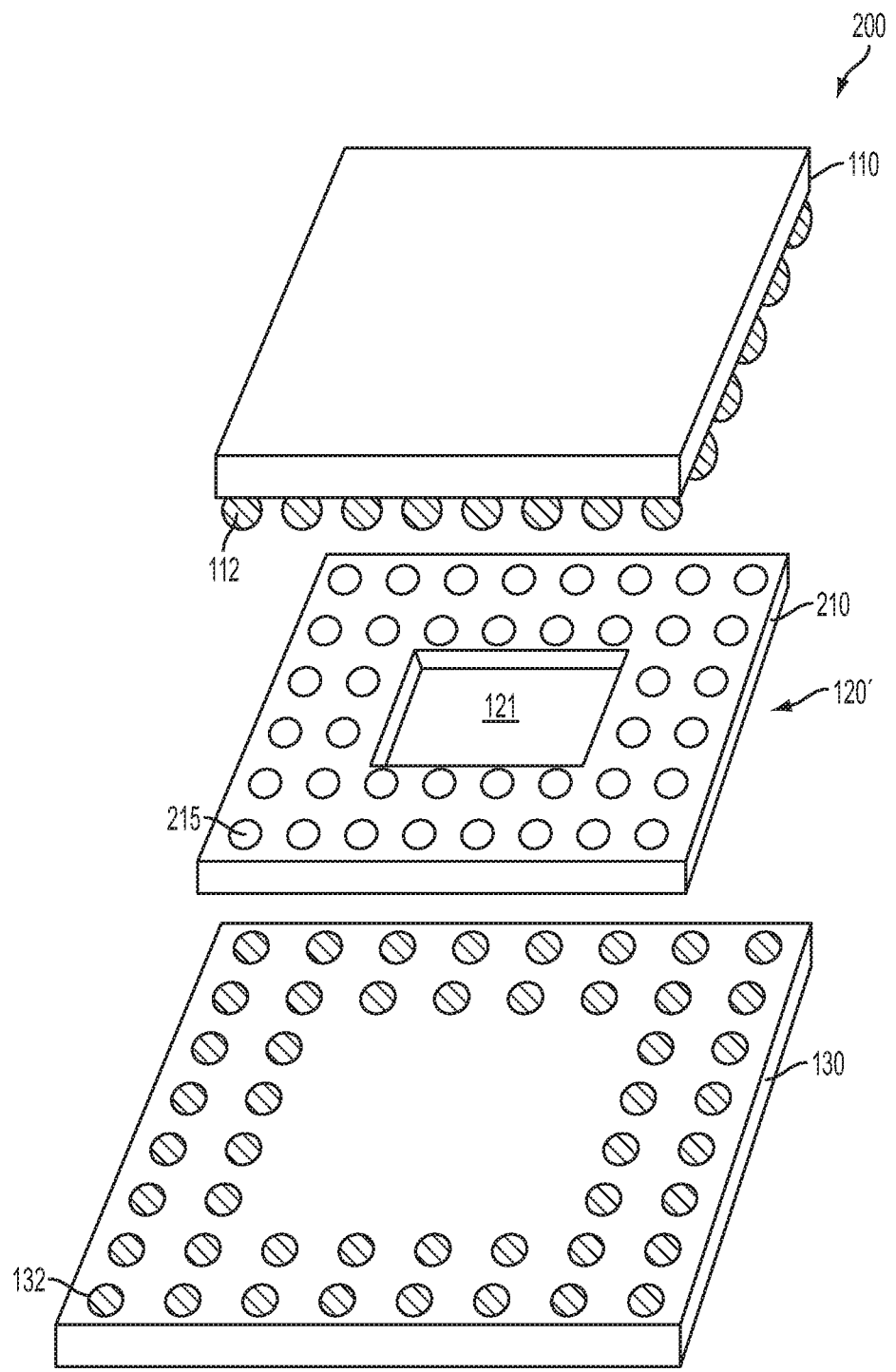
FIG. 2 is an exploded view of a PoP package including a package over another package, which is over yet another package in accordance with some embodiments.

FIG. 2 is an exploded view of a PoP package 200 including package 110 over package 120', which is over package 130, in accordance with some embodiments. Package 110 and substrate 130 have been described above. FIG. 2 shows package 120' that includes a semiconductor die 121, which is surrounded by an interposer frame 210. The interposer frame 210 has through substrate holes (TSHs) 215, which allow the bumps (or balls) 112 on package 110 to bond with bumps (or balls) 132 of substrate 130. Portions of bumps 112 and portions of bumps 132 reflow to fill the through substrate holes (TSHs) 215 to form connectors that electrically couple the package 110, the substrate, and/or the die 121. The TSHs may be formed by mechanical drill or by laser drill and the width of the openings can be made smaller than TMVs described above. In some embodiments using the laser drill technology, it is easier to form a through substrate hole in a substrate within a given area constraint than forming an opening in the substrate. Therefore, in some embodiments, the width of TSHs by laser drill ranges from about 50 μm to about 250 μm, which is smaller than width $W_1$ of TMVs described above. The smaller width of TSHs and the bonding process enable the pitch of the connectors on interposer frame 210 to be smaller than pitch $P_1$ of connector 115 described above. In some embodiments, the pitch of connectors on interposer frame 210 may be in a range from about 75 μm to about 500 μm. In some embodiments, the pitch of connectors on interposer frame 210 may be in a range from about 75 μm to about 300 μm.

Figure 3A:
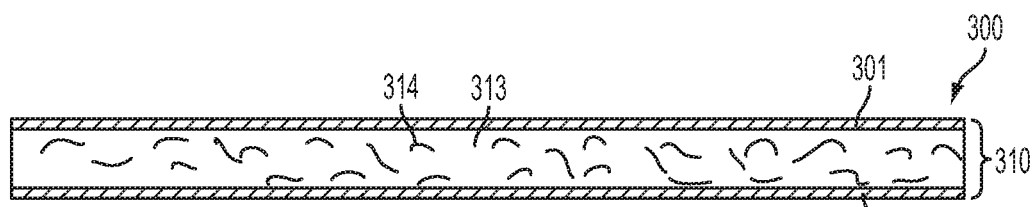
FIGS. 3A-3F are cross-sectional views of an interposer frame at various manufacturing stages in accordance with some embodiments.

FIGS. 3A-3F are cross-sectional views of an interposer frame at various manufacturing stages in accordance with some embodiments. Interposer frame 300 is similar to interposer frame 210 of FIG. 2, in some embodiments. FIG. 3A shows a substrate 310 coated with a conductive layer 301 on one side and a conductive layer 302 on the other side, in accordance with some embodiments. In some embodiments, conductive layers 301 and 302 are added to provide strength to substrate 310. In some embodiments, layers 301 and 302 are not needed. Substrate 310 comprises a dielectric material. In some embodiments, substrate 310 is made of a base material 313 mixed with one or more additives 314. For example, substrate 310 may be made of polyimide (a base material 313) mixed with glass fiber (an additive 314) to increase the strength of substrate 310. Substrate 310 is manufactured to have sufficient strength and stiffness to sustain stress applied on it during packaging process and during usage. In some embodiments, the Young's modulus of substrate 310 is in a range from about 5 GPa to about 100 GPa. Glass fiber has higher stiffness than Polyimide. Various amount or percentage of glass fiber may be added to polyimide to increase the strength of substrate 310. In some embodiments, the weight percentage of fiber glass in substrate 310 is in a range from about 5% to about 60%.

Base material 313 may be made of other materials, such as glass, silicon, gallium arsenide, silicon on insulator ("SOI"), epoxy, polymers (thermoset or thermoplastic), molding compound, epoxy, plastic, ceramic, or combinations thereof. Examples of plastic materials for base material 313 include, but are not limited to, polyvinyl chloride (PVC), acrylonitrile butadiene styrene (ABS) polymer, polypropylene (PP), polyethylene (PE), polystyrene (PS), polymethyl mechacrylate, (PMMA), polyethylene terephthalate (PET), polycarbonates (PC), or polyphenylenesulfide (PPS).

Various additives 314 may be added to base material 313 to provide desirable properties of substrate 310. For example, a flame resistant material (an additive) can be added to base material 313. In some embodiments, the substrate 310 includes bismaleimide triazine (BT) resin, and/or FR-4 (a composite material composed of woven fiberglass cloth with an epoxy resin binder that is flame resistant). In some alternative embodiments, substrate 310 includes epoxy, resin, and glass fiber, or resin coated copper. The thickness of substrate 310 is in a range from about 20 μm to about 500 μm. In some embodiments, the Young's modulus of substrate 310 is in a range from about 5 GPa to about 100 GPa.

Conductive layers 301 and 302 may be formed by various processes, such as sputtering and/or plating. Conductive layers 301 and 302 may be formed simultaneously or in sequence. In some embodiments, conductive layers 301 and 302 include copper. Alternatively, other conductive materials may be used instead of copper. For example, conductive layers 301 and 302 may include solder, solder alloy, gold, gold alloy, etc. Exemplary elements in a solder alloy may include Sn, Pb, Ag, Cu, Ni, bismuth (Bi), or combinations thereof. In some embodiments, each of conductive layers 301 and 302 has a thickness in a range from 0.5 μm to about 40 μm.

Figure 3B:
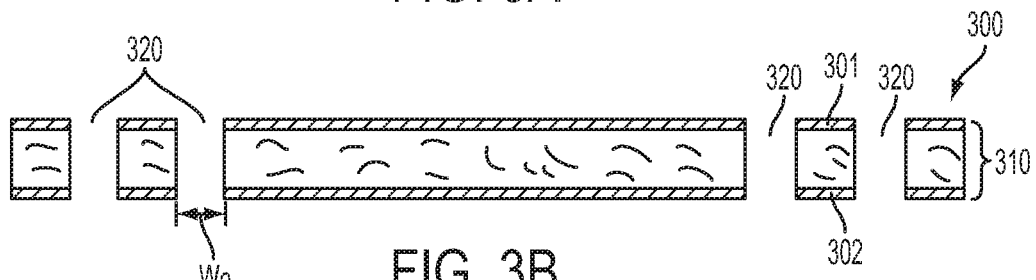

After conductive layers 301 and 302 are formed, openings 320 for TSHs 215 are formed, as shown in FIG. 3B in accordance with some embodiments. Openings 320 may be formed by mechanical drill or by laser drill. In some embodiments, the width $W_2$ of openings 320 is in a range from about 50 µm to about 250 µm.

Figure 3C:
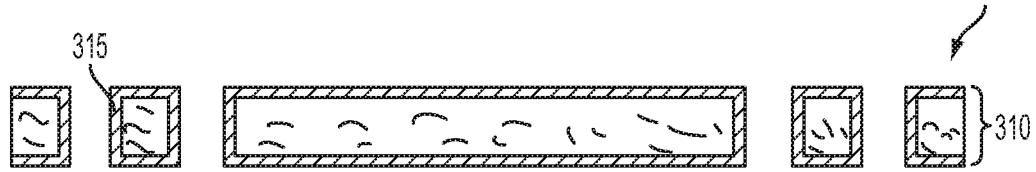

After openings 320 are formed, a seed conductive layer 315 is formed on the side walls of openings 320 and on other exposed surfaces, as shown in FIG. 3C in accordance with some embodiments. In some embodiments, seed conductive layer 315 includes copper. Other conductive materials may also be used. The thickness of seed conductive layer 315 is in a range from about 0.1 µm to about 3 µm. In some embodiments, seed conductive layer 315 is formed by electroless plating. However, other deposition methods, such as sputtering, may also be used.

Figure 3D:

After conductive layer 315 is formed, a main conductive layer 330 is plated on substrate 310 to cover conductive layer 301 and seed conductive layer 315, as shown in FIG. 3D in accordance with some embodiments. In some embodiments, the main conductive layer 330 includes copper. Other conductive materials may also be used. In some embodiments, the thickness of main conductive layer 330 is in a range from 2 µm to about 40 µm. In some embodiments, main conductive layer 330 is formed by electro-chemical plating (ECP).

Figure 3E:
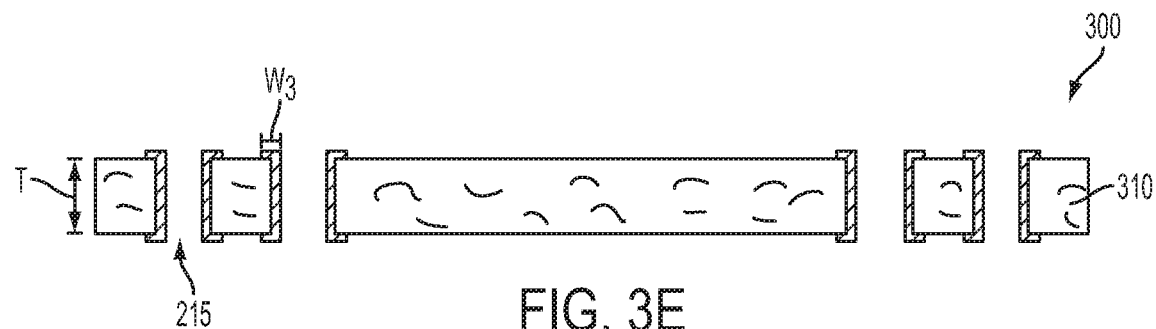

After the main conductive layer 330 is deposited, a patterning process is performed to selectively remove conductive layers 301/330 and/or 302/330 away from openings 320, as shown in FIG. 3E in accordance with some embodiments. FIG. 3E shows that the conductive layer(s) near openings 320 have remained after the patterning process. The patterning process may include depositing a photoresist on substrate 310 and using a photolithographical process to define regions where the conductive layers need to be removed. After substrate 310 is patterned, an etching process is performed to remove conductive layers not covered by the photoresist. After the etching process, through substrate holes (TSHs) 215 are formed with conductive layers surrounding the TSHs 215, as shown in FIG. 3E in accordance with some embodiments. FIG. 3E shows that the width $W_3$ of conductive layer(s) surrounding through substrate holes (TSHs) 215 is in a range from about 2 µm to about 100 µm. In some embodiment, the thickness T of substrate 310 is in a range from about 20 µm to about 500 µm.

Figure 3F:
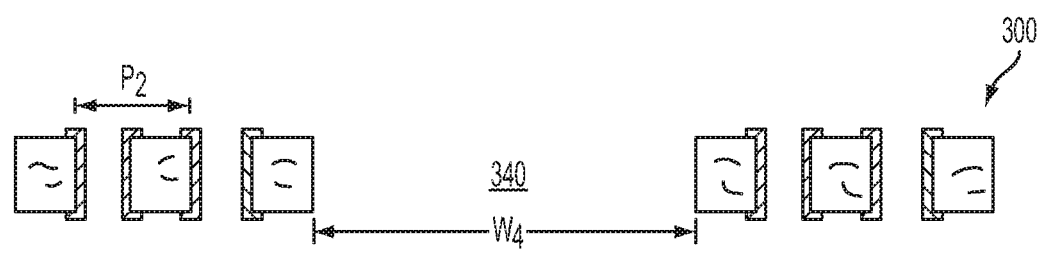

After the conductive layers 301/330 and/or 302/330 are patterned and selectively removed, a region 340 for placing a semiconductor die 121 is formed, as shown in FIG. 3F in accordance with some embodiments. Substrate material in region 340 is removed by a mechanical process, such as routing. A routing process uses a sharp tool to cut through substrate to remove substrate materials at a predetermined region. Other suitable mechanical processes may also be used. In some embodiments, the pitch $P_2$ of the openings through substrate holes (TSHs) 215 is in a range from about 75 µm to about 500 m. The width $W_4$ of region 340 with substrate 310 removed to make room for inserting a semiconductor die, such as die 121, is in a range from about 2 mm to about 500 mm in some embodiments.

Figure 4A:
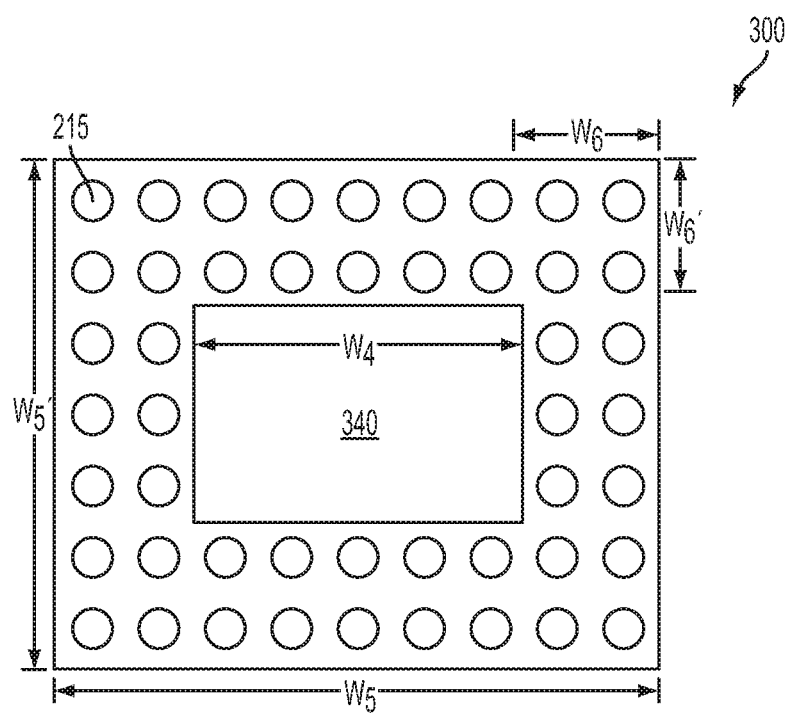
FIG. 4A is a top view of the interposer frame of FIG. 3F, in accordance with some embodiments.
Figure 4B:
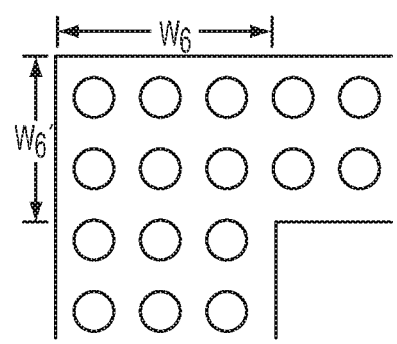
FIG. 4B is a top view of a portion of an interposer frame with different numbers of rows and columns, in accordance with some embodiments.

FIG. 4A is a top view of the interposer frame 300 of FIG. 3F, in accordance with some embodiments. Through substrate holes (TSHs) 215 are distributed across the interposer frame 300. The interposer frame in FIG. 4A has a rectangular shape. In some embodiments, the width $W_5$ of interposer frame 300 in a range from about 2.5 mm to about 800 mm. In some alternative embodiments, interposer frame 300 could be in a square shape or other shapes. The frame of the interposer frame 300 of FIG. 4A has a width $W_6$ in a first direction and a width $W_6'$ in a second direction, which is perpendicular to the first direction. In some embodiments, the width $W_6$ equals the width $W_6'$. In some alternative embodiments, $W_6$ could be different from $W_6'$. For example, width $W_6$ could be wider than width $W_6'$, and the interposer frame 300 is set to have more columns (or rows) of through substrate holes (TSHs) 215 along the first direction than that along the second direction. For example, a first portion of the frame of the interposer frame 300 having width $W_6$ could have 3 columns of through substrate holes (TSHs) 215 versus that of a second portion of frame of the interposer frame 300 having width $W_6'$, which has 2 rows of through substrate holes (TSHs) 215, as shown in FIG. 4B in accordance with some embodiments. There could be any number of rows and/or columns of through substrate holes (TSHs) 215 for interposer frame 300. The width $W_6$ or $W_6'$ is in a range from about 300 µm to about 300 mm in some embodiments.

FIG. 5A is a cross-sectional view of a TSH 215 of an interposer frame 210 being placed between a bump 112 of package 110 and a bump 132 of package 130 in a manner displayed in FIG. 2, in accordance with some embodiments. Packages 110 and 130 are pressed against interposer frame 210 to allow bump 112 and bump 132 come in contact with TSH 125. Bump 112 and bump 132 are made of a conductive material(s). In some embodiments, bump 112 and bump 132 are made of solder. A reflow process is then performed to allow the solder material in bump 112 and bump 132 to flow and fill the TSH 125, as shown in FIG. 5B in accordance with some embodiments. TSHs 125 filled with reflowed solder behave similarly to through substrate vias (TSVs), which provides electrical connection and can help dissipate heat. The substrate 310 used to form the interposer frame 300 (or 210) can be made to have a coefficient of thermal expansion (CTE) close to materials next to the substrate 310.

FIG. 6 is a cross-sectional view 600 of a portion of a PoP package after the solder layers of the upper and the lower packages fill TSHs 215 to form TSVs 215', in accordance with some embodiments. FIG. 6 shows that packages 110, 120', and 130 are bonded together. Packages 110 and 130 have TSVs 119 and 139 respectively. In some embodiments, a redistribution layer (RDL) (not shown) may be formed on package 120' to enable fan out connection of semiconductor chip 620.

Substrate 310 of interposer frame 210 comes in contact with molding compound or underfill 610, which surrounds semiconductor chip 620. Molding compound 610 also comes in contact with a passivation layer 630 of package 120'. The passivation layer 630 may be made of a polymer, such as polyimide. The CTE of molding compound 610 is selected to be close to the CTE of the passivation layer 630. In some embodiments, the CTE of the molding compound or underfill 610 is in a range from about 3 ppm/° C. to about 50 ppm/° C. The base material 313 and additives 314 can be selected to achieve a CTE of substrate 310 close to the CTE of molding compound 610. In some embodiments, the CTE of substrate 310 is in a range from about 3 ppm/° C. to about 50 ppm/° C. Due to better matching of CTEs of substrate 310 and the surrounding material(s), the PoP package can withstand better thermal cycling during packaging process and during usage. Packages using TMVs, such as the PoP package of FIGS. 1A and 1B, could have delamination of solder joints due to CTE mismatch. In addition, the TSVs 215' are better insulated from each other than the TMVs shown in FIG. 1B.

In addition, by adding strength enhancer to the substrate 310, such as fiber glass, the strength of substrate 310 is better than the strength of molding compound of package 120. As a result, the PoP package using interposer frame described above would perform better under drop test than the PoP package of FIGS. 1A and 1B. Drop test is a test of dropping a package from a certain height to see if the package can survive the impact with the ground. Drop test is important for hand-held devices.

The mechanisms of using an interposer frame to form a PoP package are provided in the disclosure. The interposer frame is formed by using a substrate with one or more additives to adjust the properties of the substrate. The interposer frame has openings lined with conductive layer to form through substrate vias (TSVs) with solder balls on adjacent packages. The interposer frame enables the reduction of pitch of TSVs, mismatch of CTEs, shorting, and delamination of solder joints, and improves mechanical strength of the package.

In some embodiments, an interposer frame for forming a package on package (PoP) structure is provided. The interposer frame includes a substrate made of a base material and at least one additive. The at least one additive adjusts a strength and a coefficient of thermal expansion of the substrate. The substrate defines a plurality of through substrate holes (TSHs) therein, and the TSHs have side walls that are lined by a conductive layer. The substrate also defines an opening therein for receiving a semiconductor die, wherein the interposer frame is part of the PoP structure to connect an upper substrate and a lower substrate.

In some other embodiments, an interposer frame for forming a package on package (PoP) structure is provided. The interposer frame includes a substrate made of a base material and at least one additive. The at least one additive adjusts a strength and a coefficient of thermal expansion of the substrate. The substrate defines a plurality of through substrate holes (TSHs) therein, wherein the TSHs have side walls that are lined by a conductive layer. The TSHs has a pitch in a range from about 75 µm to about 300 µm. The substrate also defines an opening therein for receiving a semiconductor die. The interposer frame is part of the PoP structure to connect an upper substrate and a lower substrate.

In yet some other embodiments, a method of forming an interposer frame is provided. The method includes providing a substrate with a first surface and a second surface, and the first surface and the second surface oppose each other. The method also includes coating the first surface and the second surface with a conductive layer, and forming through substrate holes (TSHs) in the substrate. The method further includes forming a conductive liner layer on the side walls of the TSHs, and plating a conductive layer surrounding and on the side walls of the TSHs. In addition, the method includes removing a central region of the substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package comprising:
    a first substrate comprising a first plurality of connectors;
    an interposer frame arranged over the first substrate, the interposer frame comprising:
        an interposer substrate having a plurality of through substrate holes (TSHs) which are aligned with the first plurality of connectors, respectively, and having an opening whose width is greater than a width of each TSH of the plurality of TSHs, wherein the interposer substrate is made of a base material and at least one additive and the at least one additive adjusts a strength and a coefficient of thermal expansion of the interposer substrate; and
        a conductive layer lining sidewalls of each TSH of the plurality of TSHs, the conductive layer filling less than an entirety of each TSH, wherein the conductive layer comprises a first metal that lines the sidewalls of each TSH and a second metal different from the first metal that lines an upper surface of the interposer substrate;
    a semiconductor die arranged in the opening in the interposer substrate; and
    a second substrate arranged over the interposer frame and electrically connected to the first plurality of connectors, wherein a conductive structure extends through at least one TSH of the plurality of TSHs to electrically connect the second substrate to a connector of the first plurality of connectors.

2. The package of claim 1, wherein the conductive structure includes solder to electrically connect the second substrate to the first plurality of connectors.

3. The package of claim 1, wherein the plurality of TSHs each pass entirely through a periphery region of the interposer substrate and collectively surround a central region of the interposer substrate in which the opening is arranged.

4. The package of claim 1, wherein the base material is selected from a group consisting of glass, silicon, gallium arsenide, silicon on insulator, epoxy, polymers, molding compound, epoxy, plastic, and ceramic; and the additive is selected from a group consisting of fiber glass.

5. The package of claim 1, wherein the conductive layer establishes a plurality of ring-like structures that line the sidewalls of the plurality of TSHs, respectively.

6. The package of claim 5, wherein the plurality of ring-like structures collectively laterally surround the semiconductor die.

7. The package of claim 5, wherein a ring-like structure of the plurality of ring-like structures extends outward beyond outer faces of the interposer frame to cover portions of the outer faces of the interposer frame, and wherein the conductive structure extends fully through a central opening in the ring-like structure to electrically connect the second substrate to the connector of the first plurality of connectors.

8. The package of claim 7, wherein the ring-like structure includes copper.

9. A package comprising:
    a first substrate comprising a first plurality of connectors;
    a second substrate comprising a second plurality of conductive bumps or conductive balls;

an interposer frame arranged between the first substrate and the second substrate, the interposer frame comprising:
  an interposer substrate having a plurality of through substrate holes (TSHs) which are aligned with the first plurality of connectors, respectively, and having an opening whose width is greater than a width of each TSH of the plurality of TSHs; and
  a conductive layer lining sidewalls of each TSH of the plurality of TSHs, the conductive layer filling less than an entirety of each TSH, wherein a lower surface of the interposer substrate is vertically separated from the first substrate by a first region, wherein an upper surface of the interposer substrate that is directly over the lower surface is separated from the second substrate by a second region, and wherein the first region comprises a molding compound and the second region is devoid of the molding compound; and
a conductive structure extending through a TSH of the plurality of TSHs to electrically connect a first connector of the first plurality of connectors to a first conductive bump or conductive ball of the second plurality of conductive bumps or conductive balls.

10. The package of claim 9, wherein the conductive layer establishes a plurality of conductive ring-like structures line sidewalls of the plurality of TSHs, respectively, such that a conductive ring-like structure fills less than an entirety of a corresponding TSH and leaves a central opening extending entirely through the conductive ring-like structure.

11. The package of claim 10, wherein the conductive ring-like structure includes copper and extends outward beyond outer faces of the interposer frame to cover portions of the outer faces of the interposer frame, and wherein the conductive structure extends fully through the central opening to electrically connect the first connector to the first conductive bump or conductive ball.

12. The package of claim 9, wherein the plurality of TSHs each pass entirely through a periphery region of the interposer frame and collectively surround a central region of the interposer frame, and a semiconductor die is arranged in the opening.

13. The package of claim 9, wherein the interposer frame is made of a base material and an additive, the base material being selected from a group consisting of glass, silicon, gallium arsenide, silicon on insulator, epoxy, polymer, molding compound, epoxy, plastic, and ceramic; and the additive being selected from a group consisting of fiber glass.

14. The package of claim 13, wherein a weight percentage of the fiber glass is in a range from about 5% to about 60%.

15. The package of claim 9, wherein a pitch at which the plurality of TSHs are spaced is in a range from about 75 μm to about 500 μm; and wherein the TSH of the plurality of TSHs has a width in a range from about 50 μm to about 200 μm.

16. The package of claim 9, wherein a width of the interposer frame has a width in a range from about 300 μm to about 300 mm.

17. The package of claim 9, wherein the interposer frame has a Young's modulus in a range from about 5 GPa to about 100 GPa.

18. The package of claim 9, wherein the interposer frame has a thickness, as measured perpendicularly between the first substrate and the second substrate, in a range from about 20 μm to about 500 μm.

19. The package of claim 9, wherein the interposer frame has a coefficient of thermal expansion in a range from about 3 ppm/° C. to about 50 ppm/° C.

20. A package comprising:
a first substrate comprising a first plurality of connectors;
a second substrate comprising a second plurality of conductive bumps or conductive balls;
an interposer frame arranged between the first substrate and the second substrate, the interposer frame comprising:
  an interposer substrate having a plurality of through substrate holes (TSHs) which are aligned with the first plurality of connectors, respectively, and having a central die opening laterally surrounded by the plurality of TSHs and whose width is greater than a width of each TSH of the plurality of TSHs; and
  a plurality of conductive ring-like structures lining sidewalls of the plurality of TSHs, respectively, such that a conductive ring-like structure fills less than an entirety of a corresponding TSH and leaves a central opening extending entirely through the conductive ring-like structure, wherein a first segment of the conductive ring-like structure that extends along a sidewall of the corresponding TSH comprises a first metal, and wherein a second segment of the conductive ring-like structure that extends along an upper surface of the interposer substrate comprises a second metal different from the first metal; and
solder extending through the central opening to electrically connect a first connector of the first plurality of connectors to a first conductive bump or conductive ball of the second plurality of conductive bumps or conductive balls.

* * * * *